(12) United States Patent
Wang et al.

(10) Patent No.: US 10,804,888 B1
(45) Date of Patent: Oct. 13, 2020

(54) DELAY CIRCUIT AND ELECTRONIC SYSTEM EQUIPPED WITH DELAY CIRCUIT

(71) Applicant: Artery Technology Co., Ltd., Chongqing (CN)

(72) Inventors: Zhengxiang Wang, Chongqing (CN); Wenlong Zhang, Chongqing (CN); Haitao Wang, Chongqing (CN)

(73) Assignee: Artery Technology Co., Ltd., Congqing (CN)

(*) Notice: Subject to any disclaimer, the term of this patent is extended or adjusted under 35 U.S.C. 154(b) by 0 days.

(21) Appl. No.: 16/799,857

(22) Filed: Feb. 25, 2020

(30) Foreign Application Priority Data

Jun. 5, 2019 (CN) .......................... 2019 1 0487299

(51) Int. Cl.
*H03H 11/26* (2006.01)
*H03K 5/134* (2014.01)
*G05F 3/26* (2006.01)
*G05F 1/46* (2006.01)
*H03K 5/00* (2006.01)

(52) U.S. Cl.
CPC ............. *H03K 5/134* (2014.07); *G05F 1/468* (2013.01); *G05F 3/262* (2013.01); *H03K 2005/00202* (2013.01)

(58) Field of Classification Search
CPC .......... H03K 5/134; H03K 2005/00202; G05F 1/468; G05F 3/262
USPC ....................................................... 327/276
See application file for complete search history.

(56) References Cited

U.S. PATENT DOCUMENTS

| 6,034,557 | A  | * | 3/2000 | Schultz | ................. | H03K 5/133 |
| | | | | | | 327/276 |
| 6,535,024 | B1 | * | 3/2003 | Rochard | ............... | H03K 5/156 |
| | | | | | | 327/34 |
| 8,248,171 | B1 | * | 8/2012 | Bugbee | ............... | H03K 3/0315 |
| | | | | | | 331/176 |
| 2008/0055012 | A1 | * | 3/2008 | Lim | ........................ | H03K 4/06 |
| | | | | | | 331/111 |
| 2016/0118939 | A1 | * | 4/2016 | Kong | ..................... | H03F 1/308 |
| | | | | | | 330/296 |
| 2017/0277210 | A1 | * | 9/2017 | Nilson | .................... | G05F 1/468 |
| 2019/0028089 | A1 | * | 1/2019 | R R | ....................... | H03K 3/354 |
| 2020/0059224 | A1 | * | 2/2020 | Jiang | ........................ | H03K 5/00 |

* cited by examiner

*Primary Examiner* — Metasebia T Retebo
(74) *Attorney, Agent, or Firm* — Winston Hsu (57) ABSTRACT

A delay circuit and an electronic system equipped with the delay circuit are provided. The delay circuit includes an input terminal, an output terminal, a bias current generator and a delay generator. The bias current generator is coupled between a first reference voltage and a second reference voltage, and is configured to generate a bias current. The delay generator is coupled between the first reference voltage and the second reference voltage, and is configured to generate a delay of the delay signal relative to the input signal according to the bias current. The bias current generator includes a current mirror, a current module and a transistor. The delay generator includes a first current mirror sub-circuit, a second current mirror sub-circuit, a transistor, a capacitor, a switch circuit and a Schmitt inverter, wherein the output terminal is coupled to the Schmitt inverter to output the delay signal.

20 Claims, 6 Drawing Sheets

DELAY CIRCUIT AND ELECTRONIC SYSTEM EQUIPPED WITH DELAY CIRCUIT

BACKGROUND OF THE INVENTION

1. Field of the Invention

The present invention is related to electronic circuits, and more particularly, to a delay circuit and an electronic system equipped with the delay circuit.

2. Description of the Prior Art

Delay circuits are important basic circuits in electronic devices. Conventional delay circuits may have disadvantages, however. For example, slow input slew of a certain input stage within a conventional delay circuit may result in large power consumption at this input stage. In another example, circuit features of the conventional delay circuit may be sensitive to process, voltage, and temperature (PVT), causing great delay variations, which may result in inaccuracy of operations of an electronic device. Thus, there is a need for a novel architecture to improve overall performance of an electronic system.

SUMMARY OF THE INVENTION

An objective of the present invention is to disclose a delay circuit and an electronic system equipped with the delay circuit, which can solve the problems of the prior art.

Another objective of the present invention is to disclose a delay circuit and an electronic system equipped with the delay circuit, which can achieve optimal performance of the electronic device.

Yet another objective of the present invention is to disclose a delay circuit and an electronic system equipped with the delay circuit, which can achieve lower power consumption, and higher precision with regard to process, voltage, and temperature (PVT) variations.

At least one embodiment of the present invention discloses a delay circuit. The delay circuit may comprise an input terminal, an output terminal, a bias current generator, and a delay generator. The input terminal may be configured to input an input signal into the delay circuit, and the output terminal may be configured to output a delay signal from the delay circuit. The bias current generator may be coupled between a first reference voltage and a second reference voltage, and may be configured to generate a bias current. The delay generator may be coupled between the first reference voltage and the second reference voltage, and may be configured to generate a delay of the delay signal relative to the input signal according to the bias current. The bias current generator may comprise: a current mirror, comprising a first type I transistor and a second type I transistor belonging to a type I, coupled to the first reference voltage; a current module, comprising a first type II transistor belonging to a type II and a resistor, wherein the first type II transistor is coupled between the first type I transistor and the second reference voltage, the resistor is coupled between a first node and the second reference voltage and coupled to the first type II transistor via the first node to generate a constant current to control the current mirror, where the type I and the type II respectively represent transistors with different types of channels; and a second type II transistor belonging to the type II, coupled between the second type I transistor and the first node. The delay generator may comprise: a first current mirror sub-circuit, comprising a third type I transistor belonging to the type I, coupled to the first reference voltage and the second type I transistor to form a first current mirror; a second current mirror sub-circuit, comprising a fourth type I transistor belonging to the type I, coupled to the first reference voltage and the second type I transistor to form a second current mirror; a third type II transistor belonging to the type II, coupled between the fourth type I transistor and the second reference voltage; a capacitor, coupled between a second node and the second reference voltage and coupled to the third type II transistor via the second node; a switch circuit, coupled to the input terminal, configured to control charging of the capacitor via the second node in response to a transition of the input signal, to control the delay via the third type II transistor; and a Schmitt inverter, coupled to a node between the fourth type I transistor and the third type II transistor, wherein the output terminal of the delay circuit is coupled to the Schmitt inverter to output the delay signal.

At least one embodiment of the present invention discloses an electronic system equipped with the aforementioned delay circuit. The electronic system may comprise at least one delay module, wherein any delay module within said at least one delay module is implemented by configuring the delay circuit to be a rising edge triggered delay circuit or a falling edge triggered delay circuit. In addition, the electronic system may operate according to an output of said at least one delay module.

In comparison with conventional delay circuits, the delay circuit of the present invention has less power consumption and high precision with respect to PVT variations, thus enabling the electronic device to achieve optimal performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
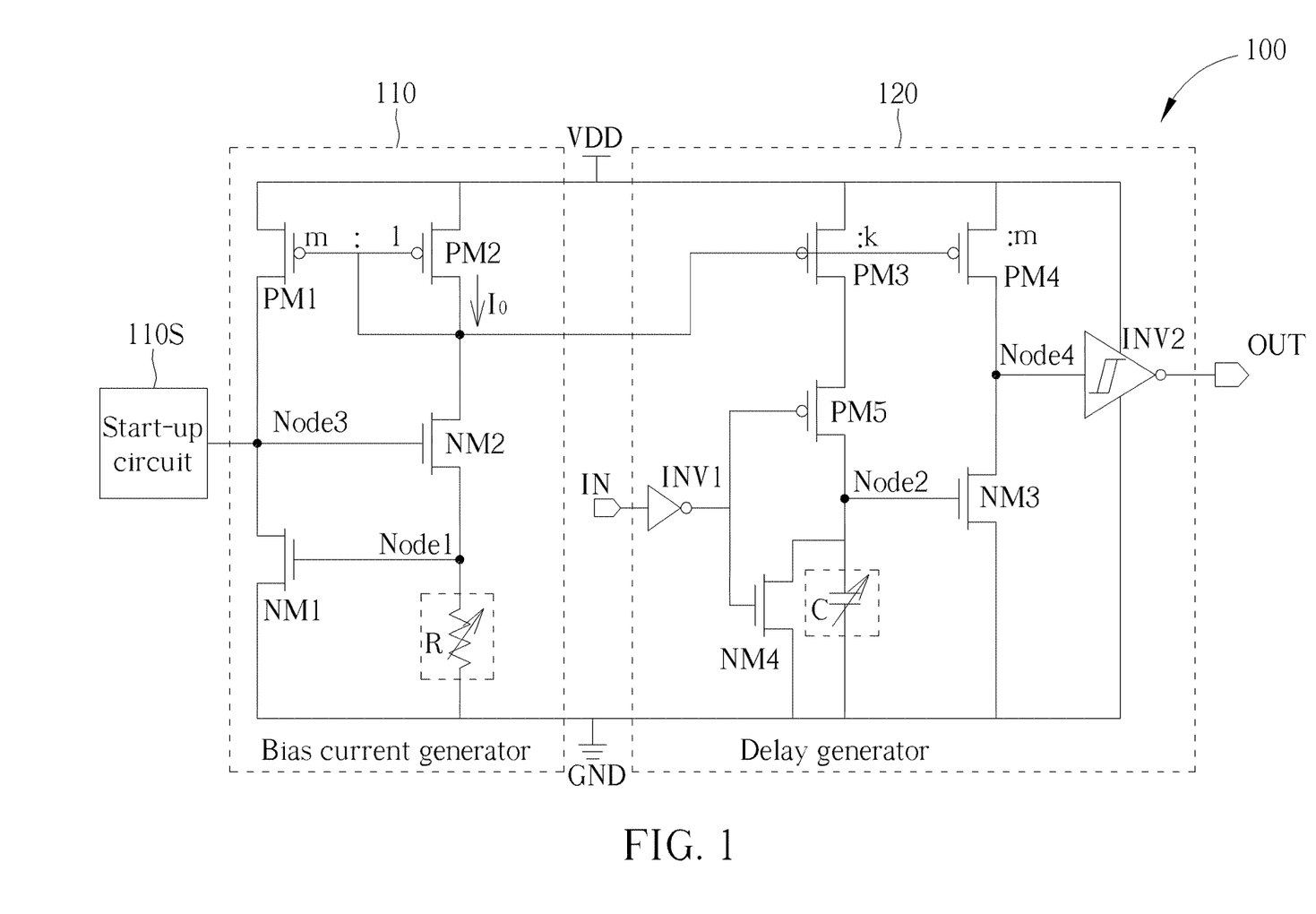
FIG. 1 is a diagram illustrating a delay circuit according to an embodiment of the present invention.

FIG. 1 is a diagram illustrating a delay circuit 100 according to an embodiment of the present invention. The delay circuit 100 may comprise an input terminal IN, an output terminal OUT, a bias current generator 110, a start-up circuit 1105 and a delay generator 120, where the input terminal IN may be configured to input an input signal into the delay circuit 100, and the output terminal OUT may be configured to output a delay signal from the delay circuit 100. The delay circuit 100 may operate according to a first reference voltage and a second reference voltage, and may comprise transistors with different types of channels, such as transistors respectively belonging to a type I and a type II. The architecture shown in FIG. adopts some types of Metal Oxide Semiconductor Field Effect Transistors (MOSFETs) such as P-type and N-type MOSFETs, but the present invention is not limited thereto. The bias current generator 110 and the delay generator 120 may be coupled between the first reference voltage and the second reference voltage, where the bias current generator 110 may generate a bias current, and the delay generator 120 may generate a delay of the delay signal relative to the input signal according to the bias current. According to this embodiment, the first reference voltage and the second reference voltage may respectively represent a power voltage VDD and a ground voltage GND, and the type I and the type II may respectively represent a P-type channel transistor and an N-type channel transistor, such as a P-type MOSFET and an N-type MOSFET, but the present invention is not limited thereto.

As shown in FIG. 1, the bias current generator 110 may comprise: a current mirror, which may comprise a first type I transistor and a second type I transistor belonging to the type I (e.g. transistor PM1 and PM2 belonging to the P type), and may be coupled to the first reference voltage such as the power voltage VDD via respective source terminals of the first type I transistor and the second type I transistor; a current module, which may comprise a first type II transistor belonging to the type II (e.g. a transistor NM1 belonging to the N type) and a resistor R, where the first type II transistor may be coupled between a drain terminal of the first type I transistor (e.g. transistor PM1) and the second reference voltage such as the ground voltage GND, the resistor R may be coupled between a node Node1 and the second reference voltage such as the ground voltage GND, and coupled to a drain terminal of the first type II transistor (e.g. the transistor NM1) via the node Node1 to generate a constant current (e.g. a current $I_0$) to control the current mirror, and more particularly, to make the constant current correspond to a gate-to-source voltage Vgs of the first type II transistor; and a second type II transistor belonging to the type II (e.g. a transistor NM2 belonging to the N type), which may be coupled between a drain terminal of the second type I transistor (e.g. the transistor PM2) and the node Node1. In addition, a drain terminal and a gate terminal of the second type I transistor (such as a drain terminal and a gate terminal of the transistor PM2) are coupled to each other, to make the second type I transistor be configured as a diode-connected transistor. A gate terminal of the second type II transistor (such as a gate terminal of the transistor NM2) is coupled to a node Node3 between respective drain terminals of the first type I transistor and the first type II transistor (such as respective drain terminals of the transistors PM1 and NM1).

The delay generator 120 may be coupled to the bias current generator 110, the input terminal IN and the output terminal OUT. As shown in FIG. 1, the delay generator 120 may comprise: a first current mirror sub-circuit, which may comprise a third type I transistor belonging to the type I (e.g. a transistor PM3 belonging to the P type), and may be coupled to the first reference voltage such as the power voltage VDD via a source terminal of the third type I transistor, and further coupled to a gate terminal of the second type I transistor (e.g. the transistor PM2) via a gate terminal of the third type I transistor to form a first current mirror; a second current mirror sub-circuit, which may comprise a fourth type I transistor belonging to the type I (e.g. a transistor PM4 belonging to the P type), and may be coupled to the first reference voltage such as the power voltage VDD via a source terminal of the fourth type I transistor, and further coupled to the gate terminal of the second type I transistor (e.g. the transistor PM2) via agate terminal of the fourth type I transistor to form a second current mirror; a third type II transistor belonging to the type II (e.g. a transistor NM3 belonging to the N type), which may be coupled between a drain terminal of the fourth type I transistor (e.g. the transistor PM4) and the second reference voltage such as the ground voltage GND; a capacitor C, which may be coupled between a node Node2 and the second reference voltage such as the ground voltage GND, and may be coupled to a gate terminal of the third type II transistor (e.g. the transistor NM3) via the node Node2; a switch circuit, which may be coupled to the input terminal IN, and may be configured to control charging of the capacitor C via the node Node2 in response to a transition of the input signal, to control the delay via the third type II transistor (e.g. the transistor NM3), where the switch circuit may comprise a fifth type I transistor and a fourth type II transistor respectively belonging to the type I and the type II (e.g. transistors PM5 and NM4 respectively belonging to the P type and the N type), and may be coupled between the third type I transistor (e.g. the transistor PM3) and the first reference voltage such as the ground voltage GND via respective source terminals of the fifth type I transistor and the fourth type II transistor, and more particularly, respective gate terminals of these two transistors may be coupled to the input terminal IN via an inverter INV1 in this embodiment; and a Schmitt inverter INV2, which may be coupled to a node Node4 between the fourth type I transistor and the third type II transistor (e.g. the transistors PM4 and NM3), and more particularly, coupled to respective drain terminals of these two transistors, where the output terminal of the delay circuit is coupled to the Schmitt inverter to output the delay signal.

According to this embodiment, respective specific parameters of the first, the second, the third, and the fourth type I transistors (e.g. the transistors PM1, PM2, PM3 and PM4), such as respective channel widths thereof, may have a predetermined relationship, e.g. m: l: k: m ("m: l" is labeled beside the transistors PM1 and PM2, and ": k" and ": m" are respectively labeled beside the transistors PM3 and PM4 in FIG. 1, for better comprehension), and currents flowing through these transistors may also have the same relationship, e.g. m: l: k: m, where the symbols "k" and "m" may respectively represent real numbers greater than zero. The predetermined relationship may be modified when needed.

In response to a ratio of respective specific parameters of the third and the second type I transistors (e.g. the transistors PM3 and PM2) being equal to make the current flowing through the third type I transistor k times the current flowing through the second type I transistor, the delay circuit 100 may perform the following operations: for a resistance R of the resistor R and a capacitance C of the capacitor C (respectively indicated by italics of the same symbols for better comprehension), the bias current generator 110 may control a delay amount DELAY of the delay to be equal to 1/k times a product (R*C) of the resistance R of the resistor R and the capacitance C of the capacitor C, e.g. DELAY= (R*C)/k; and when transition of the input signal occurs (e.g. the input signal changes from a logic low state such as a low voltage level into a logic high state such as a high voltage level), the bias current generator 110 may control a voltage on the node Node2 to change from the second reference voltage towards the first reference voltage (e.g. change from the ground voltage GND towards the power voltage VDD, i.e. pull up). More particularly, for a current $I_0$ flowing through the second type I transistor (e.g. the transistor PM2), the bias current generator 110 may control a changing rate RATE of the changing of the voltage on the node Node2 to be equal to k times a quotient ($I_0/C$) of the current $I_0$ flowing through the second type I transistor (e.g. the transistor PM2) divided by the capacitance C of the capacitor C, e.g. RATE=($I_0$*k)/C. Taking the circuit architecture shown in FIG. 1 as an example, when the input signal is in the logic low state such as the low voltage level, the voltage on the node Node2 is equal to the second reference voltage such as the ground voltage GND, e.g. 0 V (Volt) to make the third type II transistor (e.g. the transistor NM3) turn off. Under this situation, a signal on the node Node4 is in the logic high state such as the high voltage level, and the delay signal is in the logic low state such as the low voltage level. When transition of the input signal occurs (e.g. the input signal changes from the logic low state into the logic high state), the voltage on the node Node2 may change from the second reference voltage towards the first reference voltage according to the changing rate RATE (more particularly, be pulled up from the ground voltage GND according to the changing rate RATE in this embodiment), to make the current flowing through the third type II transistor increase. According to this embodiment, respective specific parameters of the third and the first type II transistors (e.g. the transistors NM3 and NM1), such as respective channel widths thereof, are preferably identical to each other. At a moment the voltage on the node Node2 reaches a voltage on the node Node1, the current flowing through the third type II transistor (e.g. the transistor NM3) reaches a current flowing through the fourth type I transistor (e.g. the transistor PM4), in order to accelerate an output state transition of the Schmitt inverter INV2 to reduce power consumption of the Schmitt inverter INV2. A voltage difference between the voltage on the node Node1 and the second reference voltage may be equal to the gate-to-source voltage Vgs of the first type II transistor (e.g. the transistor NM1), so a threshold of the output state transition of the Schmitt inverter INV2 is quite low, which is helpful for a fast response of the output state transition, making the delay amount DELAY be precisely controlled. When the voltage on the Node2 is equal to the voltage on the Node1 such as the gate-to-source voltage Vgs, the signal on the node Node4 is pulled down immediately to make an output state of the Schmitt inverter INV2 change immediately, and the delay signal correspondingly changes into a logic high state such as the high voltage level.

In addition, the bias current generator 110 may control the changing rate RATE to be proportional to the current $I_0$ flowing through the second type I transistor (e.g. the transistor PM2), in order to accelerate the output state transition of the Schmitt inverter INV2 to reduce power consumption of the Schmitt inverter INV2; and during the voltage on the node Node2 changing towards the first reference voltage, the bias current generator 110 may limit the currents respectively flowing through the third type I transistor and the fourth type I transistor (e.g. the transistors PM3 and PM4) to reduce respective power consumption of the third type I transistor and the fourth type I transistor.

In addition, as the resistor R may comprise at least one variable resistor and the capacitor C may comprise at least one variable capacitor, the delay amount DELAY may be configurable (more particularly, programmable) by fine tuning at least one of the aforementioned at least one variable resistor and the aforementioned at least one variable capacitor. According to this embodiment, fine tuning the aforementioned at least one variable resistor may be further arranged to configure the current $I_0$ flowing through the second type I transistor (e.g. the transistor PM2) and currents $I_1$ and $I_2$ respectively flowing through the third and the fourth type I transistors (e.g. the transistors PM3 and PM4), where the currents $I_1$ and $I_2$ may be examples of the bias current, but the present invention is not limited thereto. For example, $I_0$=Vgs/R, $I_1$=k*$I_0$=k*(Vgs/R), and $I_2$=m*$I_0$=m*(Vgs/R).

Figure 2:
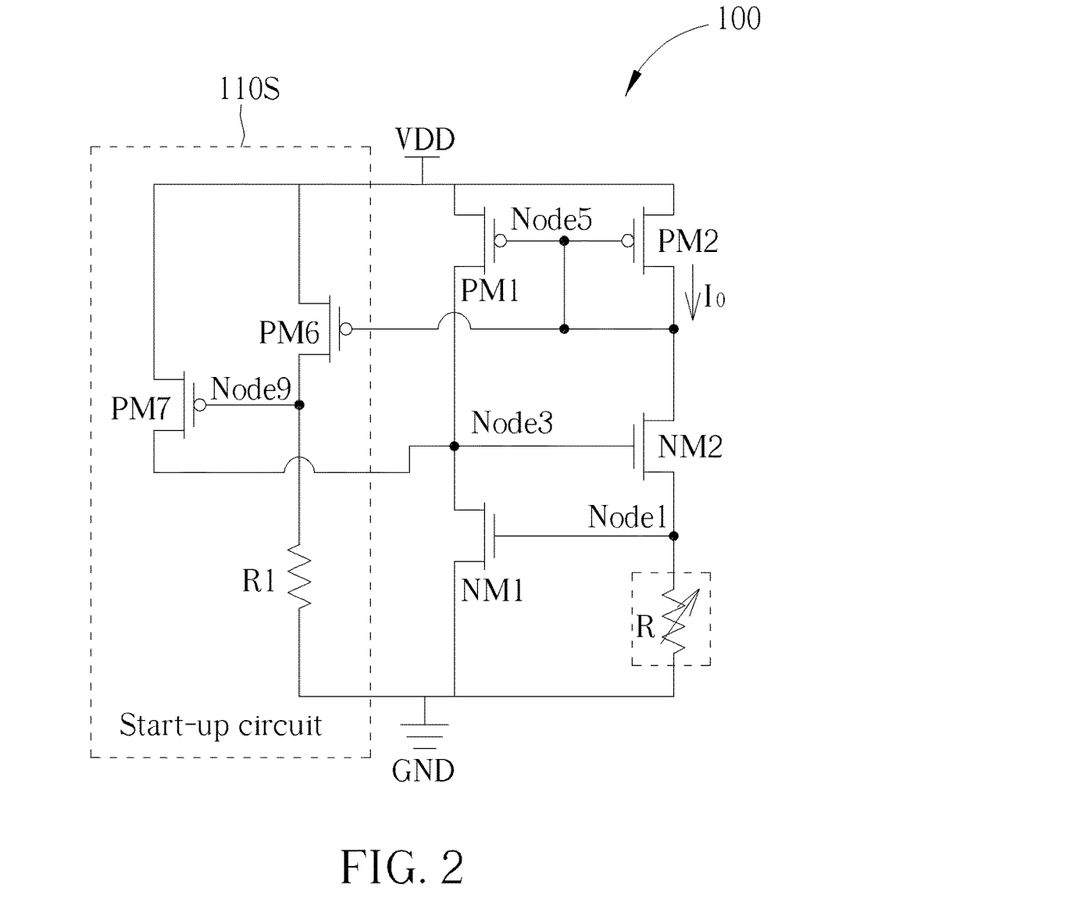
FIG. 2 illustrates detailed implementation of a start-up circuit within the delay circuit shown in FIG. 1 according to an embodiment of the present invention.

FIG. 2 illustrates detailed implementation of the start-up circuit 1105 within the delay circuit 100 shown in FIG. 1 according to an embodiment of the present invention. The start-up circuit 1105 may be coupled to the bias current generator 110 shown in FIG. 1, and may be configured to start up the bias current generator 110. For better comprehension, the circuit architecture of the bias current generator 110 is illustrated beside the start-up circuit 1105 as shown in the right-half of FIG. 2. According to this embodiment, the start-up circuit 1105 may comprise: a sixth type I transistor belonging to the type I (e.g. a transistor PM6 belonging to the P type) and another resistor such as a resistor R1, coupled between the first reference voltage such as the power voltage VDD and the second reference voltage such as the ground voltage GND; and a seventh type I transistor belonging to the type I (e.g. a transistor PM7 belonging to the P type), coupled between the first reference voltage such as the power voltage VDD and the node Node3, wherein a gate terminal of the seventh type I transistor (e.g. a gate terminal of the transistor PM7) is coupled to a node Node9 between the sixth type I transistor and the other resistor (e.g. the transistor PM6 and the resistor R1). In addition, a gate terminal of the sixth type I transistor (e.g. a gate terminal of the transistor PM6) is coupled to a node Node5 between respective gate terminals of the first type I transistor and the second type I transistor (e.g. respective gate terminals of the transistors PM1 and PM2).

Taking the circuit architecture shown in FIG. 2 as an example, before the start-up circuit 1105 starts up the bias current generator 110, $I_0$=0, a voltage on the node Node3 is equal to the second reference voltage such as the ground voltage GND, e.g. 0V, and a voltage on the node Node9 is equal to the second reference voltage such as the ground voltage GND, which may cause the seventh type I transistor (e.g. the transistor PM7) to be turned on for charging the node Node3, thereby turning on the second type II transistor (e.g. the transistor NM2), so the current $I_0$ is generated. As the sixth and the second type I transistors (e.g. the transistors PM6 and PM2) may form another current mirror, a mirror current (which is equal to the current $I_0$) of the sixth type I transistor may charge the node Node9 to the high voltage level, which may cause the seventh type I transistor (e.g. the transistor PM7) to be turned off. Accordingly, the start-up circuit 1105 finishes starting up the bias current generator 110.

Figure 3:
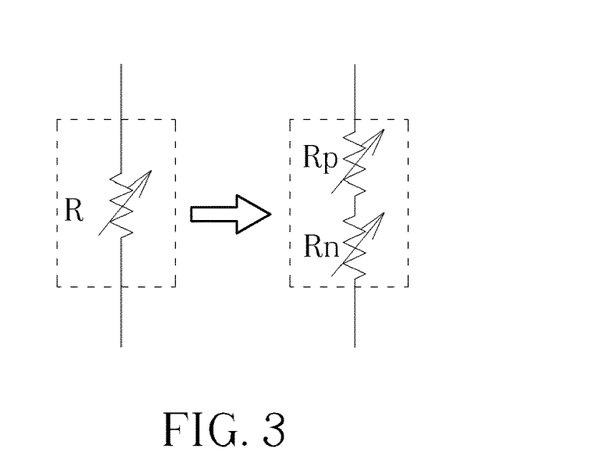
FIG. 3 illustrates detailed implementation of a resistor within the delay circuit shown in FIG. 1 according to an embodiment of the present invention.

FIG. 3 illustrates detailed implementation of the resistor R within the delay circuit 100 shown in FIG. 1 according to an embodiment of the present invention. The resistor R may comprise at least one variable resistor, which may comprise variable resistors Rp and Rn respectively having a positive temperature coefficient and a negative temperature coefficient, where the variable resistor Rp and Rn compensate each other regarding temperature, to make the resistance R of the resistor R (i.e. a total resistance of the variable resistor Rp and Rn) remain constant and insensitive to temperature.

Figure 4:
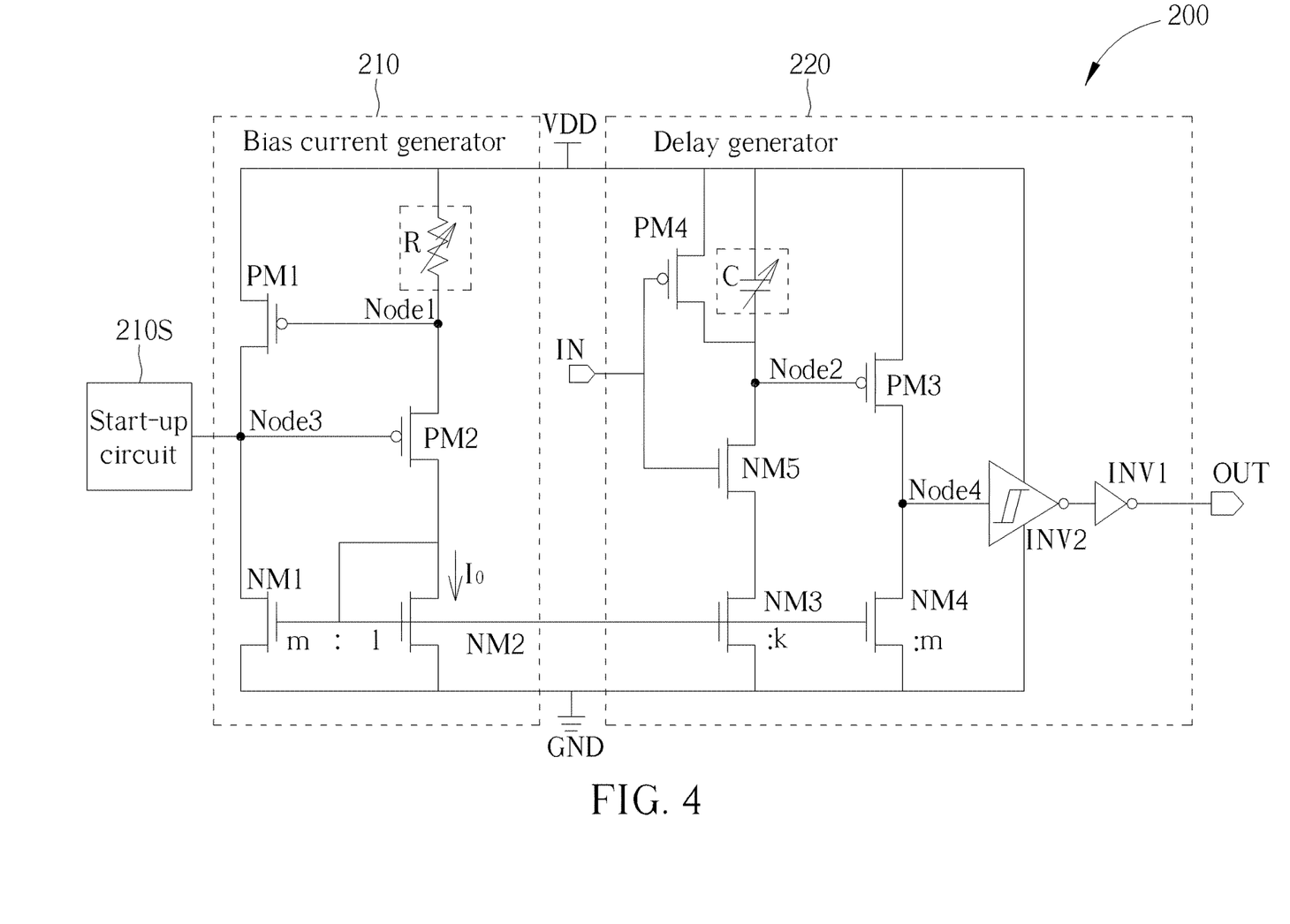
FIG. 4 is a diagram illustrating a delay circuit according to another embodiment of the present invention.

FIG. 4 is a diagram illustrating a delay circuit 200 according to another embodiment of the present invention. The delay circuit 200 may comprise an input terminal IN, an output terminal OUT, a bias current generator 210, a start-up circuit 210S and a delay generator 220, where the delay circuit 200 may be a counterpart circuit architecture of the delay circuit 100, such as a circuit architecture corresponding to an opposite polarity. For better comprehension, in this embodiment, transistors shown in FIG. 4 adopt symbols similar to the transistors shown in FIG. 1, but the present invention is not limited thereto. The delay circuit 200 may operate according to the first reference voltage and the second reference voltage, and may comprise transistors with different types of channels, such as transistors respectively belonging to a type I and a type II. The bias current generator 210 and the delay generator 220 may be coupled between the first reference voltage and the second reference voltage, where the bias current generator 210 may generate the bias current, and the delay generator 220 may generate the delay according to the bias current. According to this embodiment, the first reference voltage and the second reference voltage may respectively represent a ground voltage GND and a power voltage VDD, and the type I and the type II may respectively represent an N-type channel transistor and a P-type channel transistor, such as an N-type MOSFET and a P-type MOSFET, but the present invention is not limited thereto. In comparison with the description of the embodiment shown in FIG. 1 (e.g. the first, the second, the third, the fourth, and the fifth type I transistors and the first, the second, the third, and the fourth type II transistors respectively belonging to the type I and the type II may be respectively illustrated as the transistors PM1, PM2, PM3, PM4 and PM5 belonging to the P type and the transistors NM1, NM2, NM3 and NM4 belonging to the N type), the first, the second, the third, the fourth, and the fifth type I transistors and the first, the second, the third, and the fourth type II transistors respectively belonging to the type I and the type II may be respectively illustrated as the transistors NM1, NM2, NM3, NM4 and NM5 belonging to the N type and the transistors PM1, PM2, PM3 and PM4 belonging to the P type in this embodiment.

According to this embodiment, respective specific parameters of the first, the second, the third, and the fourth type I transistors (e.g. the transistors NM1, NM2, NM3 and NM4), such as respective channel widths thereof, may have a predetermined relationship, e.g. m: l: k: m ("m: l" is labeled beside the transistors NM1 and NM2, and ": k" and ": m" are respectively labeled beside the transistors NM3 and NM4 in FIG. 4, for better comprehension), and currents flowing through these transistors may also have the same relationship, e.g. m: l: k: m. As the circuit architecture of the delay circuit 200 may be regarded as the aforementioned counterpart circuit architecture of the delay circuit 100, similar descriptions of this embodiment are not repeated in detail for brevity.

Figure 5:
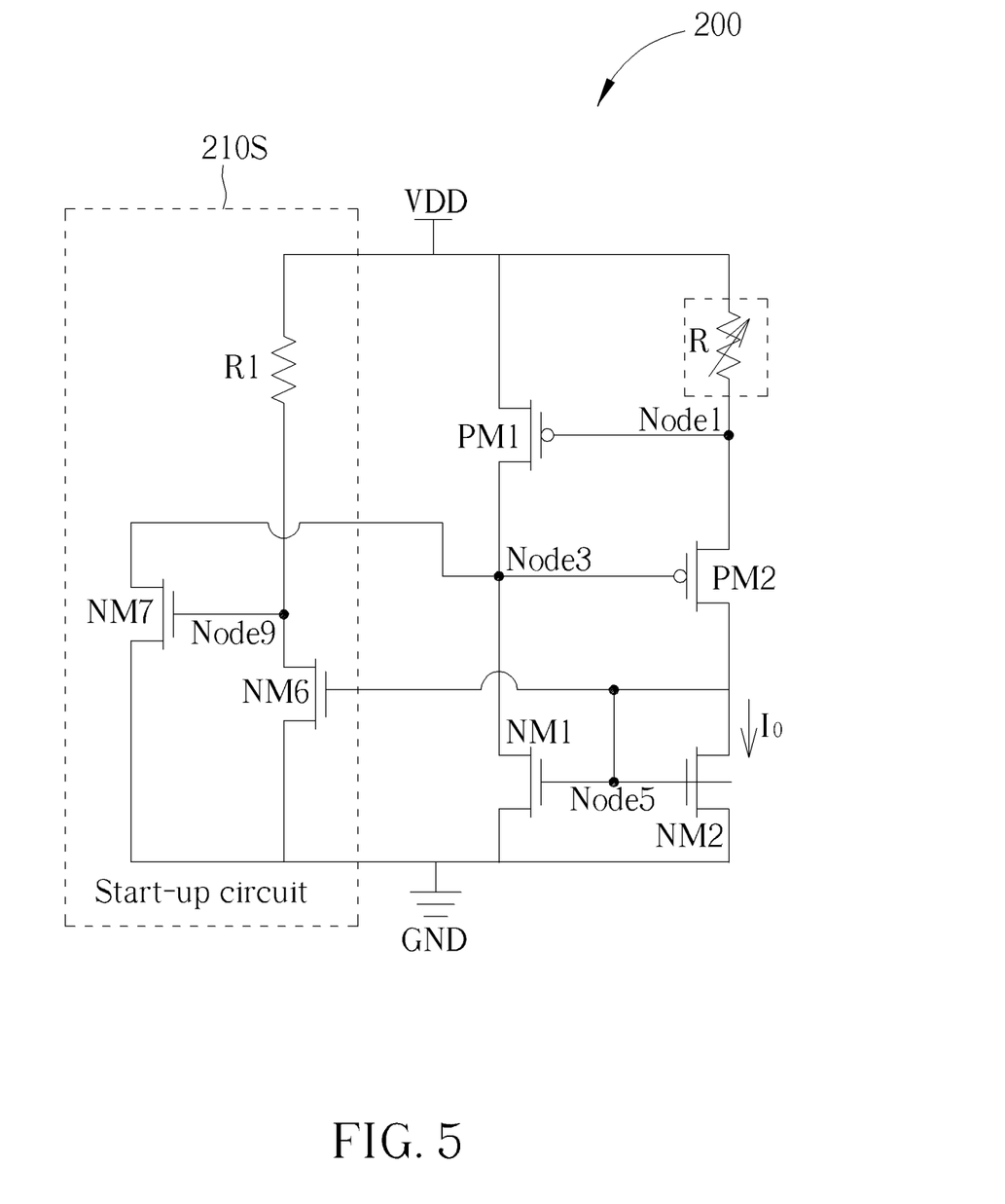
FIG. 5 illustrates detailed implementation of a start-up circuit within the delay circuit shown in FIG. 4 according to an embodiment of the present invention.

FIG. 5 illustrates detailed implementation of the start-up circuit 210S within the delay circuit 200 shown in FIG. 4 according to an embodiment of the present invention. Similarly, transistors shown in FIG. 5 adopt symbols similar to the transistors shown in FIG. 2, but the present invention is not limited thereto. In comparison with the description of the embodiment shown in FIG. 2 (e.g. the first, the second, ..., the sixth, and the seventh type I transistors and the first, the second type II transistors, etc. respectively belonging to the type I and the type II may be respectively illustrated as the transistors PM1, PM2, ..., PM6 and PM7 belonging to the P type and the transistors NM1, NM2, etc. belonging to the N type), the first, the second, ..., the sixth, and the seventh type I transistors and the first, the second type II transistors, etc. respectively belonging to the type I and the type II may be respectively illustrated as the transistors NM1, NM2, ..., NM6 and NM7 belonging to the N type and the transistors PM1, PM2, etc. belonging to the P type. As the circuit architecture of the delay circuit 200 may be regarded as the aforementioned counterpart circuit architecture of the delay circuit 100, similar descriptions of this embodiment are not repeated in detail for brevity.

According to some embodiments, the type I and the type II are selected from a group comprising the P type and the N type, where the P type and the N type respectively represent a P-type channel transistor and an N-type channel transistor. By selecting the type I and the type II and selecting the inverter INV1 to be coupled between the input terminal IN and the switch circuit or be coupled between the Schmitt inverter INV2 and the input terminal OUT, the delay circuit of the present invention is configurable to be a rising edge triggered delay circuit or a falling edge triggered delay circuit. For better comprehension, the transition of the input signal may represent an edge of the input signal changing from a first logic state into a second logic state, and the delay may represent a delay of a corresponding edge of the delay signal relative to the edge of the input signal.

Under a condition where the inverter INV1 is coupled between the input terminal IN and the switch circuit, if the type I and the type II respectively represent the P type and the N type (e.g. the delay circuit shown in FIG. 1), the first logic state and the second logic state respectively represent the logic low state and the logic high state, where the delay circuit of the present invention is configured to be the rising edge triggered delay circuit; otherwise, meaning the type I and the type II respectively represent the N type and the P type (e.g. an inverted version of the delay circuit 200 shown in FIG. 4, such as that formed by moving the inverter INV1 to a new position between the input terminal IN and the switch circuit in the architecture shown in FIG. 4, making the output terminal OUT be directly electrically connected to the output terminal of the Schmitt inverter INV2, respective gate terminals of the fifth type I transistor and the fourth type II transistor (e.g. the transistors NM5 and PM4) be coupled to the output terminal of the inverter INV1 located in this new position, and the input terminal of the inverter INV1 located in this new position be electrically connected to the input terminal IN), the first logic state and the second logic state respectively represent the logic high state and the logic low state, where the delay circuit of the present invention is configured to be the falling edge triggered delay circuit.

Under a condition where the inverter INV1 is coupled between the Schmitt inverter INV2 and the output terminal OUT, if the type I and the type II respectively represent the N type and the P type (e.g. the delay circuit 200 of FIG. 4), the first logic state and the second logic state respectively represent the logic low state and the logic high state, where the delay circuit of the present invention is configured to be the rising edge triggered delay circuit; otherwise, meaning the type I and the type II respectively represent the P type and the N type (e.g. an inverted version of the delay circuit 100 shown in FIG. 1, such as that formed by moving the inverter INV1 to a new position between the Schmitt inverter INV2 and the output terminal OUT in the architecture shown in FIG. 1, making respective gate terminals of the fifth type I transistor and the fourth type II transistor (e.g.

the transistors PM5 and NM4 respectively belonging to the P type and the N type) be directly electrically connected to the input terminal IN, and the input terminal and the output terminal of the inverter INV1 located in this new position be respectively electrically connected to the output terminal of the Schmitt inverter INV2 and the output terminal OUT), the first logic state and the second logic state respectively represent the logic high state and the logic low state, where the delay circuit of the present invention is configured to be the falling edge triggered delay circuit.

According to some embodiments, an electronic system equipped with the aforementioned delay circuit (e.g. any of the delay circuits 100 and 200, or any of respective inverted versions thereof) may comprise at least one delay module such as one or more delay modules, and the electronic system may operate according to an output of the aforementioned at least one delay module, where any delay module within the aforementioned at least one delay module is implemented by configuring the delay circuit to be the rising edge triggered delay circuit or the falling edge triggered delay circuit.

Figure 6:
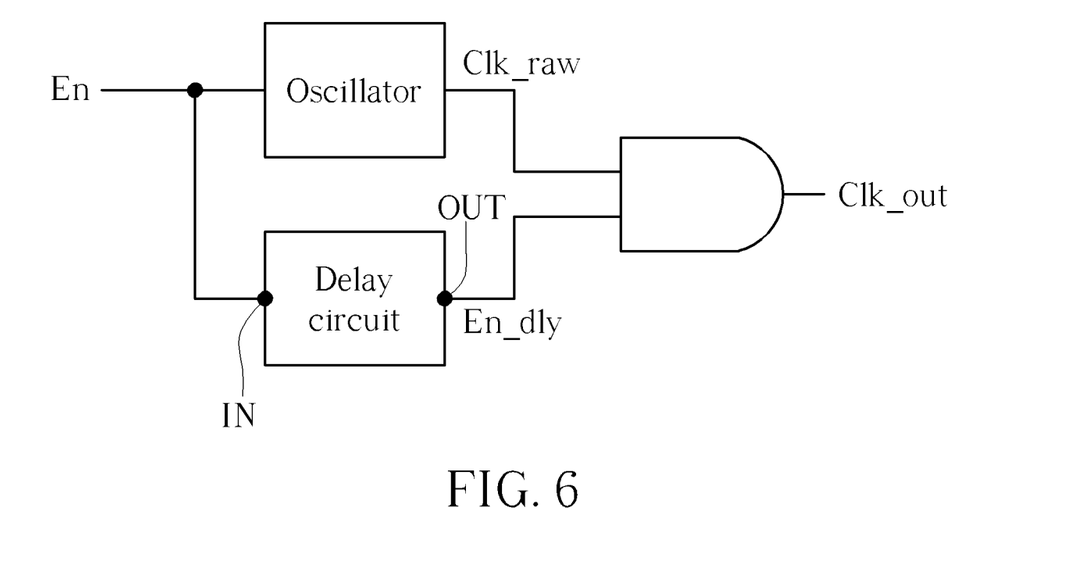
FIG. 6 is a diagram illustrating an electronic system according to an embodiment of the present invention.
Figure 7:
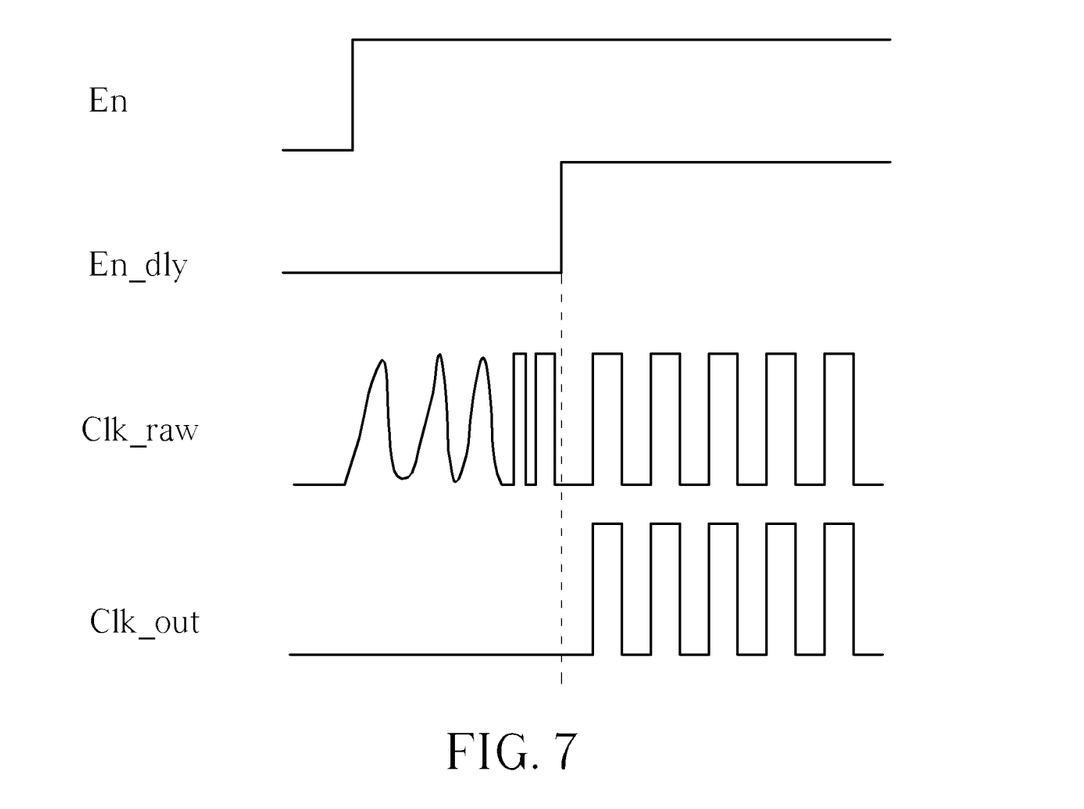
FIG. 7 illustrates associated signals of the electronic system shown in FIG. 6.

FIG. 6 is a diagram illustrating an electronic system according to an embodiment of the present invention, and FIG. 7 illustrates associated signals such as an enable signal En, a delayed enable signal En_dly and oscillation signals Clk_raw and Clk_out of the electronic system shown in FIG. 6. This electronic system may be taken as an example of the electronic system equipped with the aforementioned delay circuit. In addition to the aforementioned at least one delay module such as the delay circuit (e.g. any of the delay circuits 100 and 200), the electronic system may further comprise an oscillator, and a logic gate (e.g. an AND gate) coupled to the oscillator and the aforementioned at least one delay module. Regarding the delay circuit shown in FIG. 6, the enable signal En on the input terminal IN and the delayed enable signal En_dly on the output terminal OUT may be examples of the input signal and the delay signal of this delay circuit, respectively. The oscillator may generate an oscillation signal Clk_raw, and the logic gate may perform gating on the oscillation signal Clk_raw according to the output of the aforementioned at least one delay module (such as the delayed enable signal En_dly) to generate the oscillation signal Clk_out. The electronic system may utilize the oscillation signal Clk_out to be a clock signal, and operate according to the clock signal. Similar descriptions of this embodiment are not repeated in detail for brevity.

Figure 8:
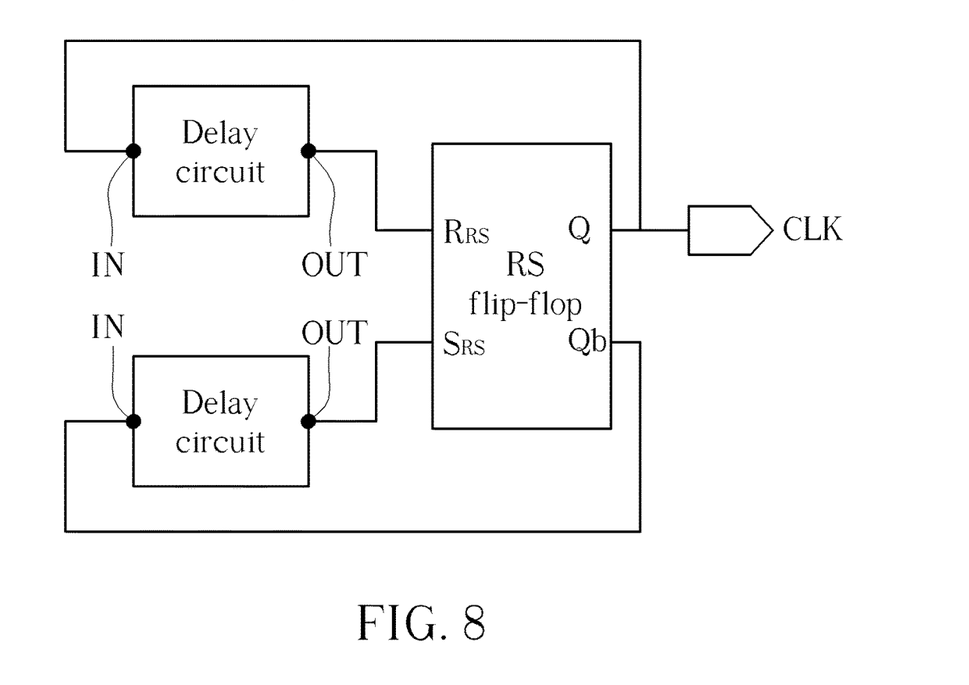
FIG. 8 is a diagram illustrating an electronic system according to another embodiment of the present invention.
Figure 9:
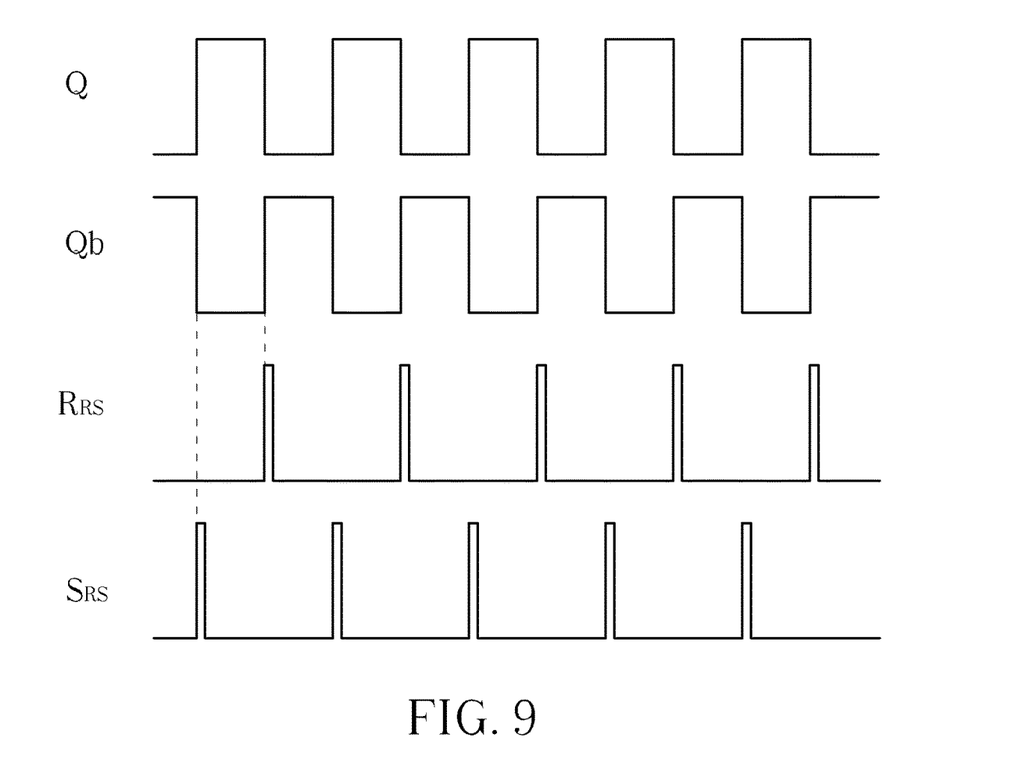
FIG. 9 illustrates associated signals of the electronic system shown in FIG. 8.

FIG. 8 is a diagram illustrating an electronic system according to another embodiment of the present invention, and FIG. 9 illustrates associated signals such as a reset signal $R_{Rs}$, a set signal $S_{Rs}$ and oscillation signals Q and Qb of the electronic system shown in FIG. 8. This electronic system may be an example of the electronic system equipped with the aforementioned delay circuit, where the aforementioned at least one delay module may comprise a first delay module and a second delay module. The first delay module may be implemented by configuring the delay circuit to be the rising edge triggered delay circuit, and the second delay module may be implemented by configuring the delay circuit to be the falling edge triggered delay circuit. In addition to these delay modules such as the delay circuits shown in FIG. 8, the electronic system may further comprise a flip-flop such as an RS flip-flop (e.g. an RS latch) and a clock terminal. Regarding each delay circuit within these delay circuits shown in FIG. 8, a signal on the input terminal IN and a signal on the output terminal OUT may be examples of the input signal and the delay signal of this delay circuit, respectively. The flip-flop such as the RS flip-flop may generate the oscillation signals Q and Qb according to respective delay operations of these delay modules, where a first input terminal and a second input terminal of the flip-flop are respectively coupled to the output of these delay modules such as these delay circuits, and input of these delay modules such as these delay circuits are respectively coupled to a first output terminal and a second output terminal of the flip-flop such as the RS flip-flop. The clock terminal may be coupled to an output terminal within the first output terminal and the second output terminal of the flip-flop such as the RS flip-flop, and may output the oscillation signal Q. The electronic system may utilize the oscillation signal Q to be a clock signal, and operate according to the clock signal.

According to some embodiments, the resistor R (e.g. the variable resistors Rp and Rn) may be implemented by a combination of polycrystalline silicon resistors having temperature coefficients with opposite signs (e.g. respectively having a positive temperature coefficient and a negative temperature coefficient). In addition, the capacitor C may be implemented by a Metal Oxide Metal Capacitor (MOM-CAP).

In comparison with the conventional delay circuit, the delay circuit of the present invention has less power consumption and higher precision with respect to process, voltage, and temperature (PVT) variations, which can enable an electronic device to achieve optimal performance. In addition, the delay circuit and the associated electronic system of the present invention may be applied to any electronic system when requiring precision timing generation or control, e.g. a design having a fast wake up oscillator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A delay circuit, comprising:
an input terminal, configured to input an input signal into the delay circuit;
an output terminal, configured to output a delay signal from the delay circuit;
a bias current generator, coupled between a first reference voltage and a second reference voltage, configured to generate a bias current, the bias current generator comprising:
a current mirror, comprising a first type I transistor and a second type I transistor belonging to a type I, coupled to the first reference voltage;
a current module, comprising a first type II transistor belonging to a type II and a resistor, wherein the first type II transistor is coupled between the first type I transistor and the second reference voltage, the resistor is coupled between a first node and the second reference voltage and coupled to the first type II transistor via the first node to generate a constant current to control the current mirror, and the type I and the type II respectively represent transistors with different types of channels; and
a second type II transistor belonging to the type II, coupled between the second type I transistor and the first node; and
a delay generator, coupled between the first reference voltage and the second reference voltage, configured to generate a delay of the delay signal relative to the input signal according to the bias current, the delay generator comprising:

a first current mirror sub-circuit, comprising a third type I transistor belonging to the type I, coupled to the first reference voltage and the second type I transistor to form a first current mirror;

a second current mirror sub-circuit, comprising a fourth type I transistor belonging to the type I, coupled to the first reference voltage and the second type I transistor to form a second current mirror;

a third type II transistor belonging to the type II, coupled between the fourth type I transistor and the second reference voltage;

a capacitor, coupled between a second node and the second reference voltage and directly connected to the third type II transistor via the second node;

a switch circuit, coupled to the input terminal, configured to control charging of the capacitor via the second node in response to a transition of the input signal, to control the delay via the third type II transistor; and a Schmitt inverter, coupled to a node between the fourth type I transistor and the third type II transistor, wherein the output terminal of the delay circuit is coupled to the Schmitt inverter to output the delay signal.

2. The delay circuit of claim 1, wherein the current mirror is coupled to the first reference voltage via respective source terminals of the first type I transistor and the second type I transistor; the first current mirror sub-circuit is coupled to the first reference voltage via a source terminal of the third type I transistor, and is further coupled to a gate terminal of the second type I transistor via a gate terminal of the third type I transistor to form the first current mirror; the second current mirror sub-circuit is coupled to the first reference voltage via a source terminal of the fourth type I transistor, and is further coupled to the gate terminal of the second type I transistor via a gate terminal of the fourth type I transistor to form the second current mirror; and the capacitor is coupled to a gate terminal of the third type II transistor via the second node.

3. The delay circuit of claim 2, wherein the first type II transistor is coupled between a drain terminal of the first type I transistor and the second reference voltage; the resistor is coupled to a gate terminal of the first type II transistor via the first node to make the constant current correspond to a gate-to-source voltage of the first type II transistor; the second type II transistor is coupled between a drain terminal of the second type I transistor and the first node; the third type II transistor is coupled between a drain terminal of the fourth type I transistor and the second reference voltage; and the Schmitt inverter is coupled to respective drain terminals of the fourth type I transistor and the third type II transistor.

4. The delay circuit of claim 1, wherein the switch circuit comprises a fifth type I transistor and a fourth type II transistor respectively belonging to the type I and the type II, and is coupled between the third type I transistor and the second reference voltage via respective source terminals of the fifth type I transistor and the fourth type II transistor.

5. The delay circuit of claim 1, wherein a gate terminal of the second type II transistor is coupled to a third node between respective drain terminals of the first type I transistor and the first type II transistor; and the delay circuit further comprises:

a start-up circuit, coupled to the bias current generator, configured to start up the bias current generator, the start-up circuit comprising:

a sixth type I transistor belonging to the type I and another resistor, coupled between the first reference voltage and the second reference voltage, wherein a gate terminal of the sixth type I transistor is coupled to a node between respective gate terminals of the first type I transistor and the second type I transistor; and a seventh type I transistor belonging to the type I, coupled between the first reference voltage and the third node, wherein a gate terminal of the seventh type I transistor is coupled to a node between the sixth type I transistor and the other resistor.

6. The delay circuit of claim 1, wherein under a condition where k is a real number greater than zero, in response to a ratio of respective specific parameters of the third type I transistor and the second type I transistor being equal to k and a current flowing through the third type I transistor being k times a current flowing through the second type I transistor, the bias current generator controls a delay amount of the delay to be equal to 1/k times a product of a resistance of the resistor and a capacitance of the capacitor.

7. The delay circuit of claim 1, wherein under a condition where k is a real number greater than zero, in response to a ratio of respective specific parameters of the third type I transistor and the second type I transistor being equal to k and a current flowing through the third type I transistor being k times a current flowing through the second type I transistor, when the transition of the input signal occurs, the bias current generator controls a changing rate of a voltage on the second node, the voltage changing from the second reference voltage towards the first reference voltage, to be equal to k times a quotient of the current flowing through the second type I transistor divided by the capacitance of the capacitor.

8. The delay circuit of claim 1, wherein when the transition of the input signal occurs, a voltage on the second node changes from the second reference voltage towards the first reference voltage to make a current of the third type II transistor increase; and at a moment the voltage on the second node reaches a voltage on the first node, a current flowing through the third type II transistor reaches a current flowing through the fourth type I transistor, to accelerate an output state transition of the Schmitt inverter to reduce power consumption of the Schmitt inverter.

9. The delay circuit of claim 1, wherein when the transition of the input signal occurs, a voltage on the second node changes from the second reference voltage towards the first reference voltage according to a changing rate; and the bias current generator controls the changing rate to be proportional to a current flowing through the second type I transistor, to accelerate the output state transition of the Schmitt inverter to reduce the power consumption of the Schmitt inverter.

10. The delay circuit of claim 1, wherein when the transition of the input signal occurs, a voltage on the second node changes from the second reference voltage towards the first reference voltage; and when the voltage on the second node changes towards the first reference voltage, the bias current generator limits currents respectively flowing through the third type I transistor and the fourth type I transistor to reduce respective power consumption of the third type I transistor and the fourth type I transistor.

11. The delay circuit of claim 1, wherein the resistor comprises at least one variable resistor; and said at least one variable resistor comprises:

a first variable resistor and a second variable resistor, respectively having a positive temperature coefficient and a negative temperature coefficient, wherein the first variable resistor and the second variable resistor compensate each other regarding temperature, to make a total resistance of the first variable resistor and the second variable resistor remain constant.

12. The delay circuit of claim 1, wherein the resistor comprises at least one variable resistor, and the capacitor comprises at least one variable capacitor; and a delay amount of the delay is programmable by fine tuning at least one of said at least one variable resistor and said at least one variable capacitor.

13. The delay circuit of claim 1, wherein a drain terminal and a gate terminal of the second type I transistor are coupled to each other, to make the second type I transistor be configured as a diode-connected transistor.

14. The delay circuit of claim 1, wherein the transition of the input signal represents an edge of the input signal changing from a first logic state into a second logic state, and the delay represents a delay of a corresponding edge of the delay signal relative to the edge of the input signal.

15. The delay circuit of claim 14, wherein the type I and the type II are selected from a group comprising a P type and an N type, and the P type and the N type respectively represent a P-type channel transistor and an N-type channel transistor; and the delay circuit further comprises:
an inverter, coupled between the input terminal and the switch circuit, wherein if the type I and the type II respectively represent the P type and the N type, the first logic state and the second logic state respectively represent a logic low state and a logic high state, otherwise, the first logic state and the second logic state respectively represent the logic high state and the logic low state.

16. The delay circuit of claim 14, wherein the type I and the type II are selected from a group comprising a P type and an N type, and the P type and the N type respectively represent a P-type channel transistor and an N-type channel transistor; and the delay circuit further comprises:
an inverter, coupled between the Schmitt inverter and the output terminal, wherein if the type I and the type II respectively represent the N type and the P type, the first logic state and the second logic state respectively represent a logic low state and a logic high state, otherwise, the first logic state and the second logic state respectively represent the logic high state and the logic low state.

17. The delay circuit of claim 1, wherein the type I and the type II are selected from a group comprising a P type and an N type, and the P type and the N type respectively represent a P-type channel transistor and an N-type channel transistor; and by selecting the type I and the type II and selecting an inverter to be coupled between the input terminal and the switch circuit or be coupled between the Schmitt inverter and the output terminal, the delay circuit is configurable to be a rising edge triggered delay circuit or a falling edge triggered delay circuit.

18. An electronic system equipped with the delay circuit of claim 1, wherein the electronic device comprises:
at least one delay module, wherein any delay module within said at least one delay module is implemented by configuring the delay circuit to be a rising edge triggered delay circuit or a falling edge triggered delay circuit;
wherein the electronic system operates according to an output of said at least one delay module.

19. The electronic system of claim 18, wherein the electronic system further comprises:
an oscillator, configured to generate an oscillation signal; and
a logic gate, coupled to the oscillator and said at least one delay module, configured to perform gating on the oscillation signal according to the output of said at least one delay module to generate another oscillation signal;
wherein the electronic system utilizes the other oscillation signal to be a clock signal, and operates according to the clock signal.

20. The electronic system of claim 18, wherein said at least one delay module comprises a first delay module and a second delay module; the first delay module is implemented by configuring the delay circuit to be the rising edge triggered delay circuit, and the second delay module is implemented by configuring the delay circuit to be the falling edge triggered delay circuit; and the electronic system further comprises:
a flip-flop, configured to generate an oscillation signal according to respective delay operations of the first delay module and the second delay module, wherein a first input terminal and a second input terminal of the flip-flop are respectively coupled to an output of the first delay module and an output of the second delay module, and an input of the first delay module and an input of the second delay module are respectively coupled to a first output terminal and a second output terminal of the flip-flop; and
a clock terminal, coupled to an output terminal within the first output terminal and the second input terminal of the flip-flop, configured to output the oscillation signal;
wherein the electronic system utilizes the oscillation signal to be a clock signal, and operates according to the clock signal.

* * * * *